(12) United States Patent
Konno

(10) Patent No.: US 10,770,601 B2
(45) Date of Patent: Sep. 8, 2020

(54) ELECTRO-CONDUCTIVE PASTE, SOLAR CELL AND METHOD FOR PRODUCING SOLAR CELL

(71) Applicant: NAMICS CORPORATION, Niigata-shi, Niigata (JP)

(72) Inventor: Seiya Konno, Niigata (JP)

(73) Assignee: NAMICS CORPORATION, Niigata (JP)

(*) Notice: Subject to any disclaimer, the term of this patent is extended or adjusted under 35 U.S.C. 154(b) by 146 days.

(21) Appl. No.: 15/579,815

(22) PCT Filed: Jun. 3, 2016

(86) PCT No.: PCT/JP2016/066552
§ 371 (c)(1),
(2) Date: Dec. 5, 2017

(87) PCT Pub. No.: WO2016/203986
PCT Pub. Date: Dec. 22, 2016

(65) Prior Publication Data
US 2018/0358484 A1    Dec. 13, 2018

(30) Foreign Application Priority Data
Jun. 17, 2015 (JP) .................. 2015-121711

(51) Int. Cl.
*H01L 31/0224* (2006.01)
*C03C 8/18* (2006.01)
(Continued)

(52) U.S. Cl.
CPC ...... *H01L 31/022425* (2013.01); *C03C 3/074* (2013.01); *C03C 8/10* (2013.01);
(Continued)

(58) Field of Classification Search
None
See application file for complete search history.

(56) References Cited

U.S. PATENT DOCUMENTS 8,512,463 B2    8/2013  Hang
8,969,709 B2    3/2015  Laughlin et al.
(Continued)

FOREIGN PATENT DOCUMENTS

JP    2011096747 A    5/2011
JP    2011096748 A    5/2011
(Continued)

OTHER PUBLICATIONS

English text machine translation of Kobamoto et al. (WO 2015030199 A1), accessed from IP.com website, copy attached as PDF pp. 1-14. (Year: 2015).*
(Continued)

*Primary Examiner* — Katie L. Hammer
(74) *Attorney, Agent, or Firm* — Holtz, Holtz & Volek PC

(57) ABSTRACT

An electro-conductive paste which includes an electro-conductive powder, a multiple oxide containing tellurium oxide, and an organic vehicle. The electro-conductive paste contains 0.1 parts by weight to 10 parts by weight of the multiple oxide based on 100 parts by weight of the electro-conductive powder, and the content ratio of the tellurium oxide in 100% by weight of the multiple oxide as $TeO_2$ is 3% by weight to 30% by weight.

11 Claims, 1 Drawing Sheet

(51) Int. Cl.
*H01B 1/22* (2006.01)
*H01L 21/288* (2006.01)
*H01L 31/0272* (2006.01)
*C03C 8/10* (2006.01)
*C03C 8/14* (2006.01)
*C03C 3/074* (2006.01)

(52) U.S. Cl.
CPC .................. *C03C 8/14* (2013.01); *C03C 8/18* (2013.01); *H01B 1/22* (2013.01); *H01L 21/288* (2013.01); *H01L 31/0272* (2013.01); *Y02E 10/50* (2013.01)

(56) References Cited

U.S. PATENT DOCUMENTS

| | | | |
|---|---|---|---|
| 2011/0094578 A1 | 4/2011 | Akimoto et al. | |
| 2011/0095240 A1* | 4/2011 | Nakamura | C03C 3/062 252/514 |
| 2011/0232746 A1 | 9/2011 | Carroll et al. | |
| 2013/0099178 A1 | 4/2013 | Hang et al. | |
| 2013/0228207 A1 | 9/2013 | Wang et al. | |
| 2014/0021417 A1* | 1/2014 | Koike | H01B 1/22 252/514 |
| 2014/0131629 A1 | 5/2014 | Choi et al. | |
| 2015/0072463 A1* | 3/2015 | Yang | H01L 31/022425 438/72 |
| 2015/0318419 A1* | 11/2015 | Hayashi | H01L 31/022425 438/608 |

FOREIGN PATENT DOCUMENTS

| | | |
|---|---|---|
| JP | 2013089600 A | 5/2013 |
| JP | 2013531863 A | 8/2013 |
| JP | 2013533187 A | 8/2013 |
| JP | 2013533188 A | 8/2013 |
| JP | 2013534023 A | 8/2013 |
| JP | 2013254726 A | 12/2013 |
| JP | 2014028713 A | 2/2014 |
| JP | 2014031294 A | 2/2014 |
| JP | 2014049743 A | 3/2014 |
| JP | 2014093312 A | 5/2014 |
| WO | WO-2015030199 A1 * | 3/2015 ......... H01L 31/1804 |

OTHER PUBLICATIONS

International Search Report (ISR) and Written Opinion dated Aug. 16, 2016 issued in International Application No. PCT/JP2016/066552.

* cited by examiner

ELECTRO-CONDUCTIVE PASTE, SOLAR CELL AND METHOD FOR PRODUCING SOLAR CELL

TECHNICAL FIELD

The present invention relates to an electro-conductive paste used to form an electrode of a semiconductor device and the like. In particular, the present invention relates to an electro-conductive paste for forming an electrode of a solar cell. In addition, the present invention relates to a method for producing a solar cell using the electro-conductive paste for forming an electrode and a solar cell produced according to the production method.

BACKGROUND ART

In semiconductor devices such as crystalline silicon solar cells that use a crystalline silicon substrate obtained by processing single crystal silicon or polycrystalline silicon into the shape of a flat sheet, electrodes are typically formed using an electro-conductive paste for electrode formation on the surface of the silicon substrate in order to realize electrical contact outside the device. Among semiconductor devices having electrodes formed in this manner, the production volume of crystalline silicon solar cells has increased considerably in recent years. These solar cells have an impurity diffusion layer, antireflective film and a light incident side electrode on one surface of a crystalline silicon substrate, and a back side electrode on the other surface. Electrical power generated by the crystalline silicon solar cell can be extracted outside the solar cell by the light incident side electrode and the back side electrode.

Electro-conductive paste containing electro-conductive powder, glass flit, organic binder, solvent and other additives has been used to form the electrodes of conventional crystalline silicon solar cells. Silver particles (silver powder) is mainly used for the electro-conductive powder. An electro-conductive paste containing tellurium oxide has been developed for use as this type of electro-conductive paste as described in Patent Documents 1 to 12.

PRIOR ART DOCUMENTS

Patent Documents

Patent Document 1: JP 2011-96747 A
Patent Document 2: JP 2011-96748 A
Patent Document 3: JP 2013-531863 A
Patent Document 4: JP 2013-533187 A
Patent Document 5: JP 2013-533188 A
Patent Document 6: JP 2013-534023 A
Patent Document 7: JP 2013-254726 A
Patent Document 8: JP 2013-89600 A
Patent Document 9: JP 2014-28713 A
Patent Document 10: JP 2014-31294 A
Patent Document 11: JP 2014-93312 A
Patent Document 12: U.S. Pat. No. 8,512,463 B

DISCLOSURE OF THE INVENTION

Problems to be Solved by the Invention

FIG. 1 shows an example of a cross-sectional schematic diagram of a typical crystalline silicon solar cell. As shown in FIG. 1, in this crystalline silicon solar cell, an impurity diffusion layer 4 (such as an n-type impurity diffusion layer having an n-type impurity diffused therein) is typically formed on the surface on the light incident side of a crystalline silicon substrate 1 (such as a p-type crystalline silicon substrate 1). An antireflective film 2 is formed on the impurity diffusion layer 4. Moreover, an electrode pattern of a light incident side electrode 20 (a front side electrode) is printed on the antireflective film 2 by a method such as screen printing using electro-conductive paste followed by drying and firing the electro-conductive paste to form the light incident side electrode 20. During this firing, the light incident side electrode 20 can be formed so as to contact the impurity diffusion layer 4 as a result of the electro-conductive paste firing through the antireflective film 2. Furthermore, fire-through refers to creating electrical continuity between the light incident side electrode 20 and the impurity diffusion layer 4 by etching an insulating film in the form of the antireflective film 2 with glass frit and the like contained in the electro-conductive paste. Since light may not be allowed to enter from the back side of the p-type crystalline silicon substrate 1, a back side electrode 15 is typically formed over nearly the entire surface of the back side. A p-n junction is formed at the interface between the p-type crystalline silicon substrate 1 and the impurity diffusion layer 4. The majority of light that has entered the crystalline silicon solar cell enters the p-type crystalline silicon substrate 1 after passing through the antireflective film 2 and the impurity diffusion layer 4, and the incident light is absorbed during the course thereof resulting in the generation of electron-hole pairs. These electron-hole pairs are separated by an electrical field generated by the p-n junction such that electrons enter the light incident side electrode 20 while holes enter the back side electrode 15. Electrons and holes (carriers) are then extracted to the outside as electrical current via these electrodes.

FIG. 2 shows an example of a schematic diagram of the surface on the light incident side of a typical crystalline silicon solar cell. As shown in FIG. 2, bus bar electrodes (light incident side bus bar electrodes) 20a and finger electrodes 20b are arranged for the light incident side electrode 20 on the surface on the light incident side of the crystalline silicon solar cell. In the examples shown in FIG. 1 and FIG. 2, electrons of the electron-hole pairs generated by incident light that has entered the crystalline silicon solar cell are collected in the finger electrodes 20b and further collected in the light incident side bus bar electrodes 20a. An interconnecting metal ribbon, the periphery of which is surrounded by solder, is soldered to the light incident side bus bar electrode 20a and electrical current is extracted to the outside by this metal ribbon.

FIG. 3 shows an example of a schematic diagram of the back side of a typical crystalline silicon solar cell. As shown in FIG. 3, back side bus bar electrodes 15a are arranged for the back side electrode 15. A back side full-surface electrode 15b is arranged over nearly the entire surface of the back side other than the where the back side bus bar electrodes 15a are arranged. In the examples shown in FIG. 1 and FIG. 3, holes of the electron-hole pairs generated by incident light that has entered the crystalline silicon solar cell are collected in the back side electrode 15 having aluminum as the main material thereof, and then further gathered in the back side bus bar electrodes 15a having silver as the main material thereof. As a result of the back side electrode 15 being formed by using as raw material an electro-conductive paste mainly composed of aluminum, which is a p-type impurity with respect to crystalline silicon, a back surface field (BSF) layer can be formed on the back side of the crystalline silicon solar cells when firing the electro-conductive paste.

However, it is difficult to solder aluminum. Consequently, bus bar electrodes mainly composed of silver (back side bus bar electrodes 15a) are formed to secure an area for soldering an interconnecting metal ribbon on the back side. Since portions are present where the back side bus bar electrodes 15a and the back side full-surface electrode 15b overlap, electrical contact is maintained between both of these electrodes. An interconnecting metal ribbon, the periphery of which is surrounded by solder, is soldered to the back side bus bar electrode 15a having silver for the main material thereof. Electrical current is then extracted to the outside by this metal ribbon.

The inventors of the present invention found that, in the case of having formed the light incident side bus bar electrode 20a or back side bus bar electrode 15a using a conventional electro-conductive paste, there is the problem of the adhesive strength (initial soldering adhesive strength) when soldering the interconnecting metal ribbon to the light incident side bus bar electrode 20a or the back side bus bar electrode 15a not being sufficiently high. As a result of adhesive strength between the metal ribbon and light incident side bus bar electrode 20a or the back side bus bar electrode 15a not being sufficiently high, in the case of having produced a solar cell module by connecting a plurality of solar cells with the metal ribbon, there is the risk of the occurrence of a disconnection within the solar cell module. There is also the risk of disconnection in an apparatus using a semiconductor device in the case of a semiconductor device other than a crystalline silicon solar cell.

Moreover, the inventors of the present invention also found that, in the case of having formed the light incident side bus bar electrode 20a or the back side bus bar electrode 15a using a conventional electro-conductive paste, there is the problem of the occurrence of a disconnection between the interconnecting ribbon and the light incident side bus bar electrode 20a or the back side bus bar electrode 15a in the case of having carried out aging treatment under prescribed conditions after having soldered the interconnecting metal ribbon to the light incident side bus bar electrode 20a or the back side bus bar electrode 15a. Furthermore, prescribed aging treatment refers to aging treatment carried out for 1 hour in a hot air dryer at 150° C. The inventors of the present invention found that this problem is caused by a decrease in adhesive strength between the metal ribbon and the light incident side bus bar electrode 20a or the back side bus bar electrode 15a attributable to aging treatment under prescribed conditions. During production of a solar cell module, the solar cell module goes through a lamination step for sealing the solar cells as well as metal ribbon and other wiring. In this lamination step, heating to a prescribed temperature is normally carried out for solidifying a sealant such as ethylene-vinyl acetate copolymer (EVA). Thus, the possibility of the occurrence of a disconnection between the interconnecting metal ribbon and the light incident side bus bar electrode 20a or the back side bus bar electrode 15a due to aging treatment under prescribed conditions means that there is the possibility of a disconnection problem in the lamination step when producing the solar cell module. There is also the risk of similar disconnections when soldering to electrodes in semiconductor devices other than crystalline silicon solar cells.

Therefore, an object of the present invention is to obtain an electro-conductive paste able to be used to form an electrode of a semiconductor device such as a solar cell that allows adhesive strength to be increased when soldering between a metal ribbon and an electrode by forming the electrode using the electro-conductive paste. In addition, an object of the present invention is to obtain an electro-conductive paste able to be used to form an electrode of a semiconductor device such as a solar cell that makes it possible to maintain a high level of adhesive strength when soldering between a metal ribbon and an electrode after having carried out aging treatment under prescribed conditions after soldering.

In addition, an object of the present invention is to obtain a crystalline silicon solar cell demonstrating high soldering adhesive strength between a metal ribbon and an electrode either immediately after soldering or after having carried out aging treatment under prescribed conditions after soldering, as well as a method for producing the crystalline silicon solar cell.

Means for Solving the Problems

The inventors of the present invention found that, by forming an electrode of a semiconductor device such as a solar cell using an electro-conductive paste containing a prescribed multiple oxide, adhesive strength when soldering an interconnecting metal ribbon and the like to an electrode can be increased, thereby leading to completion of the present invention. Moreover, the inventors of the present invention found that, if an electrode of a semiconductor device such as a solar cell is formed using an electro-conductive paste containing a prescribed multiple oxide, adhesive strength between a metal ribbon and the electrode can be maintained at a high level after having carried out aging treatment under prescribed conditions after having soldered the interconnecting metal ribbon and the like to the electrode, thereby leading to completion of the present invention.

Namely, the present invention employs the following configurations to solve the aforementioned problems. The present invention relates to an electro-conductive paste of the following Configurations 1 to 8, an electro-conductive paste set of the following Configurations 9 and 10, a method for producing a crystalline silicon solar cell of the following Configurations 11 to 14, and a crystalline silicon solar cell of the following Configurations 15 and 16.

(Configuration 1)

Configuration 1 of the present invention is an electro-conductive paste comprising an electro-conductive powder, a multiple oxide containing tellurium oxide, and an organic vehicle; wherein, the electro-conductive paste contains 0.1 parts by weight to 10 parts by weight of the multiple oxide based on 100 parts by weight of the electro-conductive powder, and the content ratio of the tellurium oxide in 100% by weight of the multiple oxide as $TeO_2$ is 3% by weight to 30% by weight.

Use of the electro-conductive paste of Configuration 1 of the present invention makes it possible to increase adhesive strength when soldering between a metal ribbon and an electrode in the formation of an electrode of a semiconductor device such as a solar cell. In addition, use of the electro-conductive paste of Configuration 1 of the present invention makes it possible to maintain a high level of adhesive strength when soldering between a metal ribbon and an electrode after having carried out aging treatment under prescribed conditions after soldering in the formation of an electrode of a semiconductor device such as a solar cell.

(Configuration 2)

Configuration 2 of the present invention is the electro-conductive paste described in Configuration 1, wherein the multiple oxide further contains at least one type of oxide selected from $Bi_2O_3$ and PbO.

The softening point of the multiple oxide can be lowered by further containing at least one type of oxide selected from $Bi_2O_3$ and PbO. Consequently, the fluidity of the multiple oxide can be adjusted during firing of the electro-conductive paste. Consequently, in the case of using the electro-conductive paste of Configuration 2 to form an electrode for a crystalline silicon solar cell, a crystalline silicon solar cell can be obtained that demonstrates favorable performance.

(Configuration 3)

Configuration 3 of the present invention is the electro-conductive paste described in Configuration 2, wherein the total content of $Bi_2O_3$ and PbO in 100% by weight of the multiple oxide is 50% by weight to 97% by weight.

As a result of the multiple oxide containing a prescribed amount of $Bi_2O_3$ and PbO, a crystalline silicon solar cell can be obtained that demonstrates more favorable performance in the case of using the electro-conductive paste to form an electrode for a crystalline silicon solar cell.

(Configuration 4)

Configuration 4 of the present invention is the electro-conductive paste described in Configuration 3, wherein the content ratio of PbO in 100% by weight of the multiple oxide is 5% by weight to 30% by weight.

As a result of making the content ratio of PbO in the multiple oxide to be of a prescribed value, a crystalline silicon solar cell demonstrating more favorable performance can be obtained at a high yield in the case of using the electro-conductive paste to form an electrode of a crystalline silicon solar cell.

(Configuration 5)

Configuration 5 of the present invention is the electro-conductive paste described in Configuration 3 or Configuration 4, wherein the content ratio of $Bi_2O_3$ in 100% by weight of the multiple oxide is 30% by weight to 80% by weight.

As a result of making the content ratio of $Bi_2O_3$ in the multiple oxide to be of a prescribed value, a crystalline silicon solar cell demonstrating more favorable performance can be obtained at a high yield in the case of using the electro-conductive paste to form an electrode of a crystalline silicon solar cell.

(Configuration 6)

Configuration 6 of the present invention is the electro-conductive paste described in any of Configurations 2 to 5, wherein the remainder of the multiple oxide is composed of at least one type of oxide selected from $SiO_2$, $B_2O_3$, $Li_2O$, $Na_2O$, $K_2O$, MgO, CaO, BaO, SrO, ZnO, $Al_2O_3$, $TiO_2$ and $ZrO_2$.

As a result of the multiple oxide containing a prescribed oxide for the residual portion thereof, in the case of using the electro-conductive paste to form an electrode of a crystalline silicon solar cell, a crystalline silicon solar cell demonstrating favorable performance can be obtained without having basically any detrimental effect on the performance of the solar cell.

(Configuration 7)

Configuration 7 of the present invention is the electro-conductive paste described in any of Configurations 1 to 6, wherein the electro-conductive powder is silver powder.

As a result of the electro-conductive powder of the electro-conductive paste of the present invention being silver powder having high conductivity, a solar cell having favorable solar cell characteristics can be obtained more reliably.

(Configuration 8)

Configuration 8 of the present invention is the electro-conductive paste described in any of Configurations 1 to 7, wherein the electro-conductive paste is an electro-conductive paste for forming a bus bar electrode of a crystalline silicon solar cell.

If the bus bar electrode of a crystalline silicon solar cell is formed using the electro-conductive paste of the present invention, adhesive strength can be increased when soldering between a metal ribbon and the bus bar electrode. In addition, if the bus bar electrode of a crystalline silicon solar cell are formed using the electro-conductive paste of the present invention, adhesive strength can be maintained at a high level when soldering between a metal ribbon and the bus bar electrode after having carried out aging treatment under prescribed conditions after soldering.

(Configuration 9)

Configuration 9 of the present invention is an electro-conductive paste set for use with solar cells comprising an electro-conductive paste for forming a bus bar electrode and an electro-conductive paste for forming a finger electrode. The electro-conductive paste for forming bus bar electrode is the electro-conductive paste described in any of Configurations 1 to 8. The electro-conductive paste for forming a finger electrode contains an electro-conductive powder, a multiple oxide and an organic vehicle. The electro-conductive paste for forming a finger electrode contains 0.1 parts by weight to 10 parts by weight of the multiple oxide based on 100 parts by weight of the electro-conductive powder. The content ratio of tellurium oxide in the multiple oxide in the electro-conductive paste for forming a finger electrode is higher than the content ratio of tellurium oxide in the multiple oxide in the electro-conductive paste for forming a bus bar electrode.

An electro-conductive paste for forming a bus bar electrode and an electro-conductive paste for a forming finger electrode have different performance requirements. The electro-conductive paste set of Configuration 9 of the present invention in the form of the electro-conductive paste for forming a finger electrode and the electro-conductive paste for forming a bus bar electrode can be preferably used to form these electrodes according to the respective performance requirements of a finger electrode and a bus bar electrode.

(Configuration 10)

Configuration 10 of the present invention is the electro-conductive paste set for use with solar cells described in Configuration 9, wherein the content ratio of tellurium oxide in the multiple oxide of the electro-conductive paste for forming a finger electrode as $TeO_2$ is 25% by weight to 75% by weight.

As a result of making the content ratio of tellurium oxide in the multiple oxide of the electro-conductive paste for a forming finger electrode to be 25% by weight to 75% by weight as $TeO_2$ as in Configuration 10 of the present invention, an electro-conductive paste can be obtained that is more suitable for forming a finger electrode.

(Configuration 11)

Configuration 11 of the present invention is a method for producing a crystalline silicon solar cell, comprising:

printing the electro-conductive paste described in any of Configurations 1 to 8 on an impurity diffusion layer of a crystalline silicon substrate or on an antireflective film of an impurity diffusion layer; and forming a bus bar electrode by drying and firing the printed electro-conductive paste.

According to the method for producing a crystalline silicon solar cell of Configuration 11 of the present invention, a crystalline silicon solar cell can be produced that is able to increase adhesive strength when soldering between a metal ribbon and a bus bar electrode. In addition, if the bus bar electrode of a crystalline silicon solar cell are formed using the electro-conductive paste of the present invention, a crystalline silicon solar cell can be produced that is able to maintain a high level of adhesive strength when soldering between a metal ribbon and the bus bar electrode after having carried out aging treatment under prescribed conditions after soldering.

(Configuration 12)

Configuration 12 of the present invention is a method for producing a crystalline silicon solar cell, comprising:

an electrode printing step for printing the electro-conductive paste for a bus bar electrode and the electro-conductive paste for a finger electrode of the electro-conductive paste set described in Configuration 9 or Configuration 10 on an impurity diffusion layer of a crystalline silicon substrate or on an antireflective film on an impurity diffusion layer; and a step for forming a bus bar electrodes and a finger electrode by drying and firing the printed electro-conductive pastes.

In the method for producing a crystalline silicon solar cell of Configuration 12 of the present invention, by using a prescribed electro-conductive paste set in the form of the electro-conductive paste for forming a finger electrode and the electro-conductive paste for forming a bus bar electrode, a suitable bus bar electrode and a suitable finger electrode can be formed. Consequently, a crystalline silicon solar cell can be produced that enables adhesive strength to be maintained at a high level when soldering between a metal ribbon and the bus bar electrode. In addition, a crystalline silicon solar cell can be produced that demonstrates low contact resistance between the finger electrode and a crystalline silicon substrate.

(Configuration 13)

Configuration 13 of the present invention is the method for producing a crystalline silicon solar cell described in Configuration 12, wherein the printing the electro-conductive paste comprises:

printing the electro-conductive paste for a finger electrode on the impurity diffusion layer of the crystalline silicon substrate or the antireflective film on the impurity diffusion layer so as to serve as a pattern of the finger electrode; and, printing the electro-conductive paste for a bus bar electrode on the impurity diffusion layer of the crystalline silicon substrate or the antireflective film on an impurity diffusion layer so as to serve as a pattern of the bus bar electrode.

As a result of printing an electro-conductive paste for forming finger electrode so as to serve as a pattern of the finger electrode and printing an electro-conductive paste for forming a bus bar electrode so as to serve as a pattern of the bus bar electrode, electrodes can be formed that are suitable for each of the finger electrodes and the bus bar electrodes.

(Configuration 14)

Configuration 14 of the present invention is the method for producing a crystalline silicon solar cell described in Configuration 12, wherein the printing the electro-conductive paste comprises:

printing the electro-conductive paste for a finger electrode on the impurity diffusion layer of the crystalline silicon substrate or on the antireflective film on the impurity diffusion layer so as to serve as a pattern of the finger electrode; and, printing the electro-conductive paste for a bus bar electrode on the impurity diffusion layer of the crystalline silicon substrate or the antireflective film on the impurity diffusion layer so as to serve as a pattern of the finger electrode and the bus bar electrode, in that order.

According to the production method of Configuration 14 of the present invention, since the electro-conductive paste for a bus bar electrode is also printed to serve as the pattern of finger electrode, the thickness of the finger electrode can be increased. Consequently, electrical resistance of the finger electrode can be lowered in comparison with the case of printing the finger electrode with the electro-conductive paste for a finger electrode alone.

(Configuration 15)

Configuration 15 of the present invention is a crystalline silicon solar cell produced according to the production method described in Configurations 11 to 14.

In a crystalline silicon solar cell of Configuration 15 of the present invention, adhesive strength can be increased when soldering between a metal ribbon and the bus bar electrode as a result of being produced according to the aforementioned production method. In addition, the bus bar electrode of the crystalline silicon solar cell of Configuration 15 of the present invention are able to maintain high adhesive strength when soldering between a metal ribbon and the bus bar electrode after having carried out aging treatment under prescribed conditions after soldering.

(Configuration 16)

Configuration 16 of the present invention is a crystalline silicon solar cell in which the bus bar electrode contains 0.05% by weight to 1.2% by weight of elemental Te as $TeO_2$.

The crystalline silicon solar cell of Configuration 16 of the present invention is a crystalline silicon solar cell capable of increasing adhesive strength when soldering between a metal ribbon and the bus bar electrode since the bus bar electrode contain a prescribed amount of elemental Te. In addition, the bus bar electrode of the crystalline silicon solar cell of Configuration 16 of the present invention is able to maintain a high level of adhesive strength when soldering between a metal ribbon and the bus bar electrode after having carried out aging treatment under prescribed conditions after soldering.

Effects of the Invention

According to the present invention, an electro-conductive paste can be obtained that is able to increase adhesive strength when soldering between a metal ribbon and an electrode in the formation of an electrode of a semiconductor device such as a solar cell. In addition, according to the present invention, an electro-conductive paste can be obtained that is able to maintain a high level of adhesive strength when soldering between a metal ribbon and an electrode after having carried out aging treatment under prescribed conditions after soldering in the formation of an electrode of a semiconductor device such as a solar cell.

In addition, according to the present invention, a crystalline silicon solar cell demonstrating high soldering adhesive strength between a metal ribbon and an electrode either immediately after soldering or after having carried out aging treatment under prescribed conditions after soldering, as well as a method for producing that crystalline silicon solar cell, can be obtained.

MODE FOR CARRYING OUT THE INVENTION

In the present description, the term "crystalline silicon" includes single crystal and polycrystalline silicon. In addition, a "crystalline silicon substrate" refers to a crystalline silicon material formed into a suitable form, e.g., a plate-like form for forming an element, such as an electrical element or electronic element. Any method may be used to produce the crystalline silicon. For example, the Czochraski method can be used in the case of single crystal silicon, while the casting method can be used in the case of polycrystalline silicon. In addition, polycrystalline silicon ribbon, fabricated by another production method such as the ribbon pulling method, for example, or polycrystalline silicon formed on a glass or other foreign substrates, can also be used for the crystalline silicon substrate. In addition, a "crystalline silicon solar cell" refers to a solar cell that has been fabricated using a crystalline silicon substrate. In addition, open-circuit voltage (Voc), short-circuit current (Isc) and fill factor (FF), which are obtained by measuring current vs. voltage characteristics while irradiating with light, can be used as indicators representing solar cell characteristics.

The electro-conductive paste of the present invention is characterized by containing a prescribed amount of tellurium oxide (such as $TeO_2$) in a multiple oxide (glass flit) contained in the electro-conductive paste. The following provides an explanation of the electro-conductive paste of the present invention by using as an example the case of using the electro-conductive paste to form the electrodes of a crystalline silicon solar cell. Furthermore, applications of the electro-conductive paste of the present invention are not limited to the formation of electrodes of a crystalline silicon solar cell. The electro-conductive paste of the present invention can also be used to form the electrodes of ordinary semiconductor devices.

In the present description, a multiple oxide refers to that having plural oxides, for example, a metal oxide as the main material thereof, and which is typically used in the form of vitrified particles. In the present description, the multiple oxide is also referred to as "glass flit".

In the present description, an explanation is provided of the tellurium oxide present in the multiple oxide contained in the electro-conductive paste of the present invention by using the example of tellurium dioxide ($TeO_2$). Thus, in the present description, the content of tellurium oxide in the multiple oxide is the content in the case the tellurium oxide is tellurium dioxide ($TeO_2$). In the electro-conductive paste of the present invention, the tellurium oxide may also be a tellurium oxide such as tellurium monoxide or tellurium trioxide other than tellurium dioxide ($TeO_2$). In that case, the contents of other tellurium oxides can be converted based on the content of tellurium dioxide ($TeO_2$) so as to constitute the same amount of tellurium.

Figure 2:
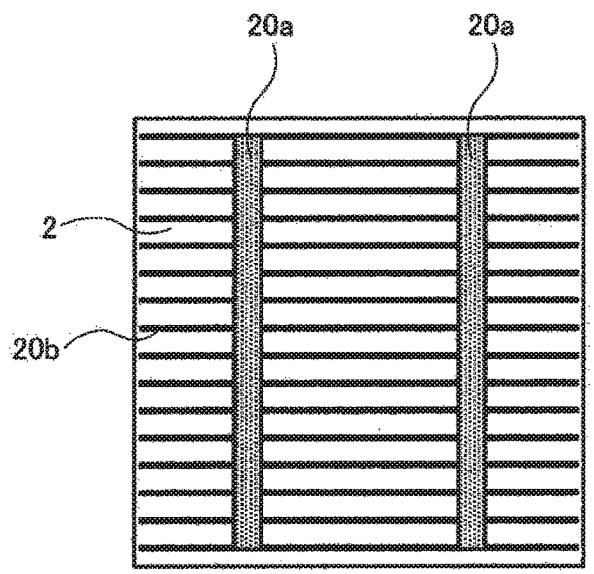
FIG. 2 is an example of a schematic diagram of the surface on the light incident side of a typical crystalline silicon solar cell.

As shown in FIG. 2, bus bar electrodes (light incident side bus bar electrodes) 20a and finger electrodes 20b are arranged as a light incident side electrode 20 on the surface on the light incident side of a crystalline silicon solar cell.

In the example shown in FIG. 2, the electrons of electron-hole pairs generated by incident light that has entered the crystalline silicon solar cell are collected in the finger electrodes 20b after passing through the n-type diffusion layer 4. Thus, contact resistance between the finger electrodes 20b and n-type diffusion layer 4 is required to be low. Moreover, the finger electrodes 20b are formed by printing a prescribed electro-conductive paste onto the antireflective film 2 with the material of titanium nitride and the like, and allowing the electro-conductive paste to fire through the antireflective film 2 during firing. Thus, the electro-conductive paste used to form the finger electrodes 20b is required to demonstrate performance that enables it to fire through the antireflective film 2.

The light incident side bus bar electrode 20a is in electrical contact with the finger electrodes 20b. An interconnecting metal ribbon, the periphery of which is surrounded by solder, is soldered to the light incident side bus bar electrode 20a. Electrical current is extracted to the outside by this metal ribbon. Thus, the soldering adhesive strength of the metal ribbon soldered to the surface of the light incident side bus bar electrode 20a is required to be high. In addition, the light incident side bus bar electrode 20a is not required to fire through the antireflective film 2 or has low contact resistance with the n-type diffusion layer 4. Conversely, in order to prevent destruction of p-n junctions formed at the interface between the n-type diffusion layer 4 and the p-type crystalline silicon substrate 1, reactivity between the electro-conductive paste used when forming the light incident side bus bar electrode 20a and the crystalline silicon substrate 1 during firing is preferably low.

As has been previously described, the electro-conductive paste for forming the light incident side bus bar electrode 20a and the electro-conductive paste for forming the finger electrode 20b have different required performance. Use of the electro-conductive paste of the present invention makes it possible to increase adhesive strength when soldering between a metal ribbon and the light incident side bus bar electrode 20a in the formation of the light incident side bus bar electrode 20a of a crystalline silicon solar cell. In addition, use of the electro-conductive paste of the present invention also makes it possible to maintain a high level of adhesive strength when soldering between a metal ribbon and the light incident side bus bar electrode 20a after having carried out aging treatment under prescribed conditions after soldering. Thus, the electro-conductive paste of the present invention can be preferably used to form the light incident side bus bar electrode 20a.

The electro-conductive paste for forming the finger electrode 20b of a crystalline silicon solar cell can use a different composition from that of the electro-conductive paste of the present invention. However, the electro-conductive paste of the present invention is able to satisfy the requirements of firing through the antireflective film 2 during firing of the electro-conductive paste and having low contact resistance between the fired electrode and n-type diffusion layer 4 depending on the content of oxide other than tellurium oxide in the multiple oxide as well as the content of other additives. Thus, by using a prescribed multiple oxide and other additives, the electro-conductive paste of the present invention can also be used when forming the finger electrode 20b. In this case, there is the advantage of being able to print the light incident side bus bar electrode 20a and the finger electrode 20b with a single round of screen printing using a single type of electro-conductive paste. In addition, two types of the electro-conductive paste of the present invention having different compositions can each be used for the light incident side bus bar electrode 20a and the finger electrode 20b. In this case, there is the advantage of being able to use an electro-conductive paste that has been optimized for each of the light incident side bus bar electrode 20a and the finger electrode 20b.

The electro-conductive paste of the present invention can preferably also be used when forming the back side bus bar electrode 15a. Use of the electro-conductive paste of the present invention makes it possible to increase adhesive strength when soldering between a metal ribbon and the back side bus bar electrode 15a when forming the back side bus bar electrode 15a of a crystalline silicon solar cell. In addition, use of the electro-conductive paste of the present invention makes it to possible to maintain a high level of adhesive strength when soldering between a metal ribbon and the back side bus bar electrode 15a after having carried out aging treatment under prescribed conditions after soldering in the formation of the back side bus bar electrode 15a of a crystalline silicon solar cell.

In addition, the electro-conductive paste of the present invention can be used to form back side electrode 15 that includes the back side full-surface electrode 15b of a crystalline silicon solar cell by using a prescribed multiple oxide and other additives.

Although the previous explanation provided an explanation of a crystalline silicon solar cell (double-sided electrode solar cell) having the light incident side electrode 20 arranged on the surface on the light incident side, the electro-conductive paste of the present invention can also be used to form the electrodes of a back side electrode-type solar cell. A back side electrode-type solar cell refers to a solar cells having both positive and negative electrodes arranged on the back side thereof without any electrodes present on the surface on the light incident side.

The mechanism by which soldering adhesive strength is increased as a result of containing tellurium oxide in a multiple oxide is still unclear. According to findings of the inventors of the present invention, adhesive strength with solder having tin as the main component thereof is presumed to become higher due to the presence of a trace amount of tellurium oxide and/or tellurium metal on the surface of the electrodes. However, the present invention is not bound by this presumption.

The following provides a detailed explanation of the electro-conductive paste of the present invention.

The electro-conductive paste of the present invention is an electro-conductive paste that contains an electro-conductive powder, a multiple oxide containing tellurium oxide ($TeO_2$), and an organic vehicle. The electro-conductive paste of the present invention contains 0.1 parts by weight to 10 parts by weight, preferably 0.5 parts by weight to 8 parts by weight, more preferably 1 part by weight to 6 parts by weight, and even more preferably 2 parts by weight to 4 parts by weight of the multiple oxide based on 100 parts by weight of the electro-conductive powder. The content ratio of tellurium oxide in 100% by weight of the multiple oxide present in the electro-conductive paste of the present invention as $TeO_2$ is 3% by weight to 30% by weight, preferably 5% by weight to 30% by weight, more preferably 6% by weight to 30% by weight, and even more preferably 6% by weight to 25% by weight.

An electro-conductive material such as a metal material can be used for the main component of the electro-conductive powder contained in the electro-conductive paste of the present invention. The electro-conductive paste of the present invention preferably uses silver in the form of silver powder for the electro-conductive powder. Furthermore, the electro-conductive paste of the present invention can contain elements other than silver, such as gold, copper, nickel, zinc or tin, within a range that does not impair the performance of the solar cell electrodes. However, the electro-conductive powder is preferably composed of silver from the viewpoint of obtaining low electrical resistance and high reliability.

There are no particular limitations on the shape or size of particles of the electro-conductive powder. Examples of particle shapes include spheres and flakes. Particle size refers to the size of the longest part of a single particle. Particle size of the electro-conductive powder is preferably 0.05 μm to 20 μm and more preferably 0.1 μm to 5 μm.

In general, since microparticle size has a fixed distribution, it is not necessary for all particles to have the aforementioned particle size, but rather the particle size equal to 50% of the integrated value of all particles (D50) is preferably the range of the aforementioned particle size. In addition, the average value of particle size (average particles) maybe within the aforementioned range. This applies similarly to the size of particles other than particles of the electro-conductive powder described in the present description. Furthermore, average particle diameter can be determined by measuring particle size distribution according to the microtrac method (laser diffraction/scattering method) followed by obtaining the D50 value from the results of particle size distribution measurement.

In addition, the size of the electro-conductive powder can also be expressed with a BET value (BET specific surface area). The BET value of the electro-conductive powder is preferably 0.1 $m^2/g$ to 5 $m^2/g$ and more preferably 0.2 $m^2/g$ to 2 $m^2/g$.

Next, an explanation is provided of the multiple oxide contained in the electro-conductive paste of the present invention.

The electro-conductive paste of the present invention contains a prescribed multiple oxide. The prescribed multiple oxide refers to a multiple oxide containing tellurium oxide (such as $TeO_2$). Tellurium oxide is an essential component of the multiple oxide contained in the electro-conductive paste of the present invention.

The content ratio of the prescribed multiple oxide is 0.1 part by weight to 10 parts by weight, preferably 0.5 parts by weight to 8 parts by weight, more preferably 1 part by weight to 6 parts by weight, and even more preferably 2 parts by weight to 4 parts by weight based on 100 parts by weight of the electro-conductive powder. As a result of containing a prescribed amount of the prescribed multiple oxide relative to the content of the electro-conductive powder, adhesiveness between the electrodes, substrate and metal ribbon can be increased while retaining electrical conductivity of the electrodes attributable to the electro-conductive powder.

The content ratio of tellurium oxide as $TeO_2$ in 100% by weight of the prescribed multiple oxide is 3% by weight to 30% by weight, preferably 5% by weight to 30% by weight, more preferably 6% by weight to 30% by weight, and even more preferably 6% by weight to 25% by weight. If an electrode of a semiconductor device is formed using the electro-conductive paste of the present invention containing a prescribed amount of tellurium oxide, soldering adhesive strength between a metal ribbon and the electrode can be increased, and soldering adhesive strength can be maintained at a high level even after a prescribed aging treatment. Furthermore, in the case tellurium oxide is present in a prescribed amount or more, there is the possibility of a decrease in the solar cell characteristic of open-circuit voltage (Voc). Consequently, the content ratio of tellurium oxide in the prescribed multiple oxide is required to be equal to or less than the upper limit of the aforementioned prescribed range.

In the electro-conductive paste of the present invention, the prescribed multiple oxide preferably further contains at least one type of oxide selected from $Bi_2O_3$ and PbO. The softening point of the multiple oxide can be lowered as a result of the multiple oxide further containing at least one type of oxide selected from $Bi_2O_3$ and PbO. Consequently, fluidity of the multiple oxide can be adjusted during firing of the electro-conductive paste. Consequently, in the case of using the electro-conductive paste of the present invention to form an electrode for a crystalline silicon solar cell, a crystalline silicon solar cell can be obtained that demonstrates favorable performance.

The total content of $Bi_2O_3$ and PbO in 100% by weight of the prescribed multiple oxide in the electro-conductive paste of the present invention is preferably 50% by weight to 97% by weight, more preferably 50% by weight to 80% by weight, and even more preferably 50% by weight to 70% by weight. In the case of using an electro-conductive paste having a multiple oxide containing prescribed amounts of $Bi_2O_3$ and PbO to form an electrode for a crystalline silicon solar cell, a crystalline silicon solar cell can be obtained that demonstrates more favorable performance.

In the electro-conductive paste of the present invention, the content ratio of PbO in 100% by weight of the prescribed multiple oxide is preferably 5% by weight to 30% by weight, more preferably 5% by weight to 20% by weight, and even more preferably 5% by weight to 15% by weight.

As a result of the content ratio of PbO in the multiple oxide being within a prescribed range, the softening point of the multiple oxide can be more favorably controlled in the case of using an electro-conductive paste containing that multiple oxide to form an electrode for a crystalline silicon solar cell. Consequently, a crystalline silicon solar cell can be obtained that demonstrates more favorable performance.

The content ratio of $Bi_2O_3$ in 100% by weight of the prescribed multiple oxide of the electro-conductive paste of the present invention is preferably 30% by weight to 80% by weight, more preferably 35% by weight to 70% by weight, and even more preferably 40% by weight to 60% by weight.

As a result of the content ratio of $Bi_2O_3$ in the multiple oxide being within a prescribed range, the softening point of the multiple oxide can be more favorably controlled in the case of using an electro-conductive paste containing that multiple oxide to form an electrode for a crystalline silicon solar cell. Consequently, a crystalline silicon solar cell demonstrating more favorable performance can be obtained at a high yield.

The remainder of the multiple oxide of the electro-conductive paste of the present invention is preferably composed of at least one type of oxide selected from $SiO_2$, $B_2O_3$, $Li_2O$, $Na_2O$, $K_2O$, MgO, CaO, BaO, SrO, ZnO, $Al_2O_3$, $TiO_2$ and $ZrO_2$. The remainder of the multiple oxide refers to an oxide other than the essential component of tellurium oxide and the $B_2O_3$ and PbO added as necessary that is contained in the prescribed multiple oxide.

In the multiple oxide of the electro-conductive paste of the present invention, these oxides of the remainder of the multiple oxide are not essential components. However, these metal oxides or a mixture thereof can be added within a range that does not have a detrimental effect on the characteristics of the resulting solar cell. In the case of using an electro-conductive paste having any of the aforementioned oxides as the remainder thereof to form an electrode for a crystalline silicon solar cell, a crystalline silicon solar cell demonstrating favorable performance can be obtained without having basically any detrimental effect on the performance of the solar cell.

There are no particular limitations on the shape of the particles of the multiple oxide (glass flit), and examples of thereof include spherical and irregularly shaped particles. In addition, although there are also no particular limitations on particle size, from the viewpoint of workability, the average value of particle size (D50) is preferably within the range of 0.1 μm to 10 μm and more preferably within the range of 0.5 μm to 5 μm.

One type of particle containing prescribed amounts of each of a required plurality of multiple oxides can be used for the particles of the multiple oxide (glass frit). In addition, particles composed of a single multiple oxide can also be used as different particles for each of a required plurality of multiple oxides (such as two types of particles consisting of $TeO_2$ particles and PbO particles in the case of using $TeO_2$ and PbO for the components of the multiple oxide). In addition, a plurality of types of particles having different compositions for a required plurality of multiple oxides can also be used in combination. For example, two types of particles, consisting of particles respectively containing prescribed amounts of $SiO_2$, $B_2O_3$ and PbO and particles respectively containing prescribed amounts of PbO, $Bi_2O_3$, $TeO_2$ and BaO, can be incorporated in prescribed amounts and used as multiple oxide (glass frit).

The softening point of the glass flit is preferably 300° C. to 700° C., more preferably 400° C. to 600° C., and even more preferably 500° C. to 580° C. in order to ensure proper softening performance of the glass flit when firing the electro-conductive paste of the present invention.

The electro-conductive paste of the present invention contains an organic vehicle. An organic binder and solvent can be contained for the organic vehicle. An organic binder and solvent fulfill the role of, for example, adjusting the viscosity of the electro-conductive paste, and there are no particular limitations thereon. The organic binder can also be used by dissolving in the solvent.

Cellulose derivatives (such as ethyl cellulose or nitrocellulose) and (meth)acrylic resins (such as polymethyl acrylate or polymethyl methacrylate) can be selected and used for the organic binder. The added amount of the organic binder is normally 0.2 parts by weight to 30 parts by weight and preferably 0.4 parts by weight to 5 parts by weight based on 100 parts by weight of the electro-conductive powder.

One type or two or more types of alcohols (such as terpineol, α-terpineol or β-terpineol) and esters (such as hydroxyl group-containing esters, 2,2,4-trimethyl-1,3-pentanediol monoisobutyrate or butyl carbitol acetate) can be selected and used for the solvent. The added amount of the solvent is normally 0.5 parts by weight to 30 parts by weight and preferably 5 parts by weight to 25 parts by weight based on 100 parts by weight of the electro-conductive powder.

Moreover, additives selected from plasticizers, antifoaming agents, dispersants, leveling agents, stabilizers and adhesion promoters can be further incorporated in the electro-conductive paste of the present invention as necessary. Among these, phthalic acid esters, glycolic acid esters, phosphoric acid esters, sebacic acid esters, adipic acid esters and citric acid esters can be selected and used as plasticizers.

The electro-conductive paste of the present invention can contain additive particles other than those described above within a range that does not have a detrimental effect on the solar cell characteristics of the resulting solar cell. However, in order to obtain a solar cell having favorable solar cell characteristics as well as favorable adhesive strength of the metal ribbon, the electro-conductive paste of the present invention is preferably an electro-conductive paste composed of an electro-conductive powder, the aforementioned prescribed multiple oxide (glass frit) and an organic vehicle. In addition, the glass frit preferably contains tellurium oxide ($TeO_2$) and preferably further contains $Bi_2O_3$ and PbO. In addition, a plurality of types of multiple oxides having different compositions can be used for the multiple oxide.

Next, an explanation is provided of the method for producing the electro-conductive paste of the present invention. The electro-conductive paste of the present invention can be produced by adding an electro-conductive powder, glass frit and other additive particles as necessary to the organic binder and solvent followed by mixing and dispersing therein.

Mixing can be carried out with a planetary mixer, for example. In addition, dispersion can be carried out with a three-roll mill. Mixing and dispersion are not limited to these methods, but rather various known methods can be used.

Next, an explanation is provided of the crystalline silicon solar cell of the present invention. The electro-conductive paste of the present invention can be preferably used as an electro-conductive paste for forming an electrode of a crystalline silicon solar cell.

Figure 1:
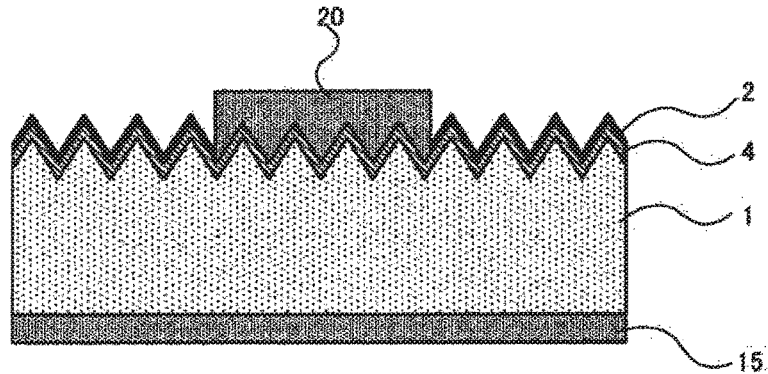
FIG. 1 is an example of a cross-sectional schematic diagram of the vicinity of a light incident side electrode of a typical crystalline silicon solar cell.
Figure 3:
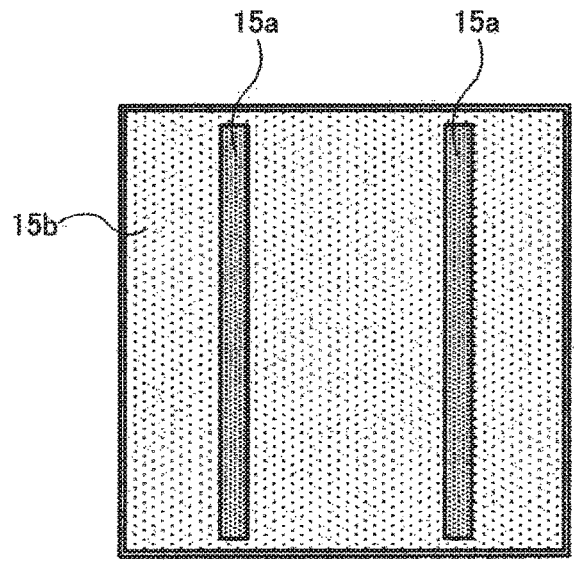
FIG. 3 is an example of a schematic diagram of the back side of a typical crystalline silicon solar cell.

FIG. 1 shows a cross-sectional schematic diagram in the vicinity of the light incident side electrode 20 of a typical crystalline silicon solar cell having electrodes (a light incident side electrode 20 and a back side electrode 15) on the surfaces of both the light incident side and back side. The crystalline silicon solar cell shown in FIG. 1 has the light incident side electrode 20 formed on the light incident side, an antireflective film 2, an n-type impurity diffusion layer (n-type silicon layer) 4, a p-type crystalline silicon substrate 1 and the back side electrode 15. In addition, FIG. 2 shows an example of a schematic diagram of the surface on the light incident side of a typical crystalline silicon solar cell. FIG. 3 shows an example of a schematic diagram of the back side of a typical crystalline silicon solar cell.

In the present description, electrodes for extracting electrical current to the outside from a crystalline silicon solar cell in the form of the light incident side electrode 20 and the back side electrode 15 may simply be collectively referred to as "electrodes".

The electro-conductive paste of the present invention can be preferably used as an electro-conductive paste for forming a bus bar electrode of a crystalline silicon solar cell.

A prescribed amount of the tellurium oxide is added to the multiple oxide contained in the electro-conductive paste of the present invention. Consequently, the formation of the bus bar electrode of a crystalline silicon solar cell using the electro-conductive paste of the present invention makes it possible to increase adhesive strength when soldering between a metal ribbon and the bus bar electrode. In addition, the formation of the bus bar electrode of a crystalline silicon solar cell using the electro-conductive paste of the present invention makes it possible to maintain a high level of adhesive strength when soldering between a metal ribbon and the bus bar electrode after having carried out aging treatment under prescribed conditions after soldering. Furthermore, in the case the amount of the tellurium oxide is equal to greater than a prescribed amount, there is the possibility of a decrease in the solar cell characteristic of open-circuit voltage (Voc). Consequently, the content ratio of tellurium oxide in the prescribed multiple oxide is required to be equal to or less than the upper limit of the aforementioned prescribed range.

Next, an explanation is provided of the electro-conductive paste set for forming solar cell electrodes of the present invention. The electro-conductive paste set for forming solar cell electrodes of the present invention is an electro-conductive paste set composed of two types of electro-conductive pastes consisting of an electro-conductive paste for forming a bus bar electrode and an electro-conductive paste for forming a finger electrode.

The electro-conductive paste for forming a bus bar electrode of the electro-conductive paste set of the present invention has components similar to those of the previously described electro-conductive paste of the present invention. Consequently, adhesive strength can be increased when soldering between a metal ribbon and bus bar electrode formed using the electro-conductive paste for forming a bus bar electrode.

The electro-conductive paste for forming a finger electrode of the electro-conductive paste set of the present invention contains an electro-conductive powder, a multiple oxide and an organic vehicle, and is characterized in that the content ratio of tellurium oxide of the multiple oxide in the electro-conductive paste for forming a finger electrode is higher than the content ratio of tellurium oxide in the multiple oxide of the electro-conductive paste for forming a bus bar electrode. Furthermore, the content of the multiple oxide in the electro-conductive paste for forming a finger electrode is 0.1 parts by weight to 10 parts by weight, preferably 0.5 parts by weight to 8 parts by weight, more preferably 1 part by weight to 6 parts by weight, and even more preferably 2 parts by weight to 4 parts by weight based on 100 parts by weight of the electro-conductive powder.

The electro-conductive paste for forming a bus bar electrode (a light incident side bus bar electrode 20a) and the electro-conductive paste for forming s finger electrode (a light incident side finger electrode 20b) have different performance requirements. The electro-conductive paste set of Configuration 9 of the present invention in the form of an electro-conductive paste for forming a finger electrode and an electro-conductive paste for forming a bus bar electrode can be preferably used to form these electrodes according to the required performance of the finger electrode 20b and the bus bar electrode 20a.

In the electro-conductive paste set for a solar cell of the present invention, the content ratio of tellurium oxide in the multiple oxide of the electro-conductive paste for forming a finger electrode as $TeO_2$ is preferably 25% by weight to 75% by weight.

In the electro-conductive paste set for a solar cell of the present invention, by making the content ratio of tellurium oxide in the multiple oxide of the electro-conductive paste for forming a finger electrode to be 25% by weight to 75% by weight as $TeO_2$, the finger electrode (the light incident side finger electrode 20b) can be formed having more suitable performance.

In the crystalline silicon solar cell of the present invention, at least a portion of the bus bar electrodes are an electrode formed using the aforementioned electro-conductive paste of the present invention (to be simply referred to as "electrode of a prescribed composition"). The bus bar electrodes include the light incident side bus bar electrodes 20a shown in FIG. 2 and the back side bus bar electrodes 15a shown in FIG. 3. Interconnecting metal ribbon, the periphery of which is surrounded by solder, is soldered to the light incident side bus bar electrode 20a and the back side bus bar electrode 15a. Electrical current is extracted outside the crystalline silicon solar cell by this metal ribbon. As a result of the bus bar electrode being electrode of a prescribed composition, a crystalline silicon solar cell can be provided that demonstrates high adhesive strength between the bus bar electrode and the metal ribbon, and particularly after aging treatment, when connecting the interconnecting metal ribbon to the electrode of a plurality of crystalline silicon solar cells.

The width of the bus bar electrode (the light incident side bus bar electrode 20a and the back side bus bar electrode 15a) can be roughly equal to that of the metal ribbon. The width is preferably wide in order to lower the electrical resistance of the bus bar electrode. On the other hand, the width of the light incident side bus bar electrode 20a is preferably narrow in order to increase the incident area of light entering the light incident side surface. Consequently, the width of the bus bar electrode is 0.5 mm to 5 mm, preferably 0.8 mm to 3 mm, and more preferably 1 mm to 2 mm. In addition, the number of bus bar electrodes can be determined according to the size of the crystalline silicon solar cell. More specifically, the number of bus bar electrodes can be 1, 2, 3 or 4. Namely, the optimum number of bus bar electrodes can be determined by simulating operation of the solar cell so as to maximize conversion efficiency of the crystalline silicon solar cell. Furthermore, since multiple crystalline silicon solar cells are mutually connected in series by interconnecting metal ribbons, the numbers of the light incident side bus bar electrodes 20a and the back side bus bar electrodes 15a are preferably the same.

The area occupied by the light incident side electrodes 20 of the surface on the light incident side is preferably as small as possible in order to increase the incident area of light entering the crystalline silicon solar cell. Consequently, the finger electrodes 20b of the surface on the light incident side are preferably as narrow as possible. On the other hand, the width of the finger electrodes 20b is preferably wide from the viewpoint of reducing electrical loss (ohmic loss). In addition, the width of the finger electrodes 20b is preferably wide from the viewpoint of reducing contact resistance between the finger electrodes 20b and the crystalline silicon substrate 1 (impurity dispersion layer 4). On the basis of the above, the width of the finger electrode 20b is 30 μm to 300 μm, preferably 50 μm to 200 μm and more preferably 60 μm to 150 μm. In addition, the number of bus bar electrodes can be determined according to the size of the crystalline silicon solar cell and the width of the bus bar electrodes. Namely, the optimum interval and number of the finger electrodes 20b can be determined by simulating solar cell operation so as to maximize conversion efficiency of the crystalline silicon solar cell.

In the crystalline silicon solar cell of the present invention, the back side electrode 15 can be formed using an electro-conductive paste of a prescribed composition. As shown in FIG. 3, the back side electrode 15 typically include back side full-surface electrode 15b containing aluminum and back side bus bar electrodes 15a in electrical contact with the back side fill-surface electrode 15b. As a result of forming the back side full-surface electrode 15a using as raw material an electro-conductive paste consisting mainly of aluminum, which is a p-type impurity with respect to crystalline silicon, a back surface field (BSF) layer can be formed on the back side of the crystalline silicon solar cell when firing the electro-conductive paste. However, since it is difficult to solder aluminum, the back side bus bar electrodes 15a, having silver as the main material thereof, are formed to secure an area for soldering. Since portions are present where the back side bus bar electrodes 15a and the back side full-surface electrode 15b overlap, electrical contact is maintained between both of these electrodes. An interconnecting metal ribbon, the periphery of which is surrounded by solder, is soldered to the back side bus bar electrode. Electrical current is extracted to the outside by this metal ribbon. In the crystalline silicon solar cell of the present invention, the back side bus bar electrodes 15a can be formed using the electro-conductive paste of the present invention. Use of the electro-conductive paste of the present invention makes it possible to provide a crystalline silicon solar cell that demonstrates high adhesive strength between the back side bus bar electrodes 15a and the metal ribbon, and particularly after aging treatment.

Next, an explanation is provided of the method for producing a crystalline silicon solar cell of the present invention.

The production method of the present invention comprises a step for forming bus bar electrodes by printing the previously described electro-conductive paste onto the impurity diffusion layer 4 of the crystalline silicon substrate 1 or on the antireflective film 2 on the impurity diffusion layer 4 followed by drying and firing. The following provides a more detailed description of the production method of the present invention.

The method for producing a crystalline silicon solar cell of the present invention comprises a step for preparing the crystalline silicon substrate 1 of a single conductivity type (p-type or n-type). For example, a B (boron)-doped p-type single crystal silicon substrate can be used for the crystalline silicon substrate 1.

Furthermore, the surface on the light incident side of the crystalline silicon substrate 1 preferably has a pyramid-like textured structure from the viewpoint of obtaining high conversion efficiency.

Next, the method for producing a crystalline silicon solar cells of the present invention comprises a step for forming the impurity diffusion layer 4 of the other conductivity type on one surface of the crystalline silicon substrate 1 prepared in the previously described step. For example, in the case of using a p-type crystalline silicon substrate 1 for the crystalline silicon substrate 1, an n-type impurity diffusion layer 4 can be formed for the impurity diffusion layer 4. Furthermore, a p-type crystalline silicon substrate 1 can be used in the crystalline silicon solar cell of the present invention. In that case, an n-type impurity diffusion layer 4 is formed for the impurity diffusion layer 4. Furthermore, a crystalline silicon solar cell can be produced using an n-type crystalline silicon substrate 1. In that case, a p-type impurity diffusion layer is formed for the impurity diffusion layer 4.

When forming the impurity diffusion layer 4, the impurity diffusion layer 4 can be formed so that the sheet resistance of the impurity diffusion layer 4 is 40 Ω/square (Ω/□) to 1500 Ω/square and preferably 45 Ω/square to 1200 Ω/square.

In addition, in the method for producing a crystalline silicon solar cell of the present invention, the depth at which the impurity diffusion layer 4 is formed can be 0.2 μm to 1.0 μm. Furthermore, the depth of the impurity diffusion layer 4 refers to the depth from the surface of the impurity diffusion layer 4 to the p-n junction. The depth of the p-n junction can be taken to be the depth from the surface of the impurity diffusion layer 4 to the location where the impurity concentration in the impurity diffusion layer 4 becomes equal to the impurity concentration of the substrate.

Next, the method for producing a crystalline silicon solar cell of the present invention comprises a step for forming the antireflective film 2 on the surface of the impurity diffusion layer 4 formed in the previously described step. A silicon nitride film (SiN film) can be formed for the antireflective film 2. In the case of using a silicon nitride film for the antireflective film 2, the layer of the silicon nitride film also has the function of a surface passivation layer. Consequently, in the case of using a silicon nitride film for the antireflective film 2, a crystalline silicon solar cell can be obtained that demonstrates a high level of performance. In addition, as a result of using a silicon nitride film for the antireflective film 2, the antireflective film 2 is able to demonstrate an antireflection function with respect to incident light. The silicon nitride film can be formed by a method such as plasma-enhanced chemical vapor deposition (PECVD).

The method for producing a crystalline silicon solar cell of the present invention comprises a step for forming the light incident side electrode 20 by printing an electro-conductive paste onto the surface of the antireflective film 2 followed by firing. In addition, the method for producing a crystalline silicon solar cell of the present invention further comprises a step for forming the back side electrode 15 by printing an electro-conductive paste on the other surface of the crystalline silicon substrate 1 following by firing. More specifically, a pattern of the light incident side electrode 20 printed using a prescribed electro-conductive paste is first dried for several minutes (such as 0.5 minutes to 5 minutes) at a temperature of about 100° C. to 150° C. Furthermore, in order to form the back side electrodes 15, an electro-conductive paste for forming the prescribed back side bus bar electrodes 15a and an electro-conductive paste for forming the back side full-surface electrode 15b are preferably printed and dried in continuation from printing and drying the pattern of the light incident side electrode 20. As was previously described, the electro-conductive paste for forming electrodes on the surface of the crystalline silicon substrate 1 of the present invention can be preferably used to form the light incident side bus bar electrodes 20a and the back side bus bar electrodes 15a.

Subsequently, the printed electro-conductive paste is fired in air under prescribed firing conditions using a tubular furnace or other firing furnace following completion of the drying thereof. Firing conditions include using air for the firing atmosphere and using a firing temperature of preferably 500° C. to 1000° C., more preferably 600° C. to 1000° C., even more preferably 500° C. to 900° C., and particularly preferably 700° C. to 900° C. During firing, the electro-conductive pastes for forming the light incident side electrode 20 and the back side electrode 15 are preferably fired simultaneously to allow both types of electrodes to be formed simultaneously. In this manner, by printing prescribed electro-conductive pastes onto the light incident side and the back side and firing simultaneously, firing for electrode formation can be carried out only once, thereby allowing the production of a crystalline silicon solar cell at lower cost.

Furthermore, in the production method of the present invention, in the case of using the previously described electro-conductive paste set for forming solar cell electrodes of the present invention, a bus bar electrode pattern and a finger electrode pattern are printed on the impurity diffusion layer 4 of the crystalline silicon substrate 1 or on the antireflective film 2 on the impurity diffusion layer 4 using the electro-conductive paste for a bus bar electrode and the electro-conductive paste for a finger electrode, respectively (electrode printing step).

More specifically, in the aforementioned electrode printing step, the electro-conductive paste for a finger electrode can be printed on the impurity diffusion layer 4 of the crystalline silicon substrate 1 or on the antireflective film 2 on the impurity diffusion layer 4 so as to form a pattern of the finger electrodes (the light incident side finger electrodes 20b). In addition, the electro-conductive paste for a bus bar electrode can be printed on the impurity diffusion layer 4 of the crystalline silicon substrate 1 or on the antireflective film 2 on the impurity diffusion layer 4 so as to form a pattern of the bus bar electrodes (the light incident side bus bar electrodes 20a). Subsequently, the printed electro-conductive pastes can be dried and fired in the same manner as the aforementioned production example to form the bus bar electrodes and the finger electrodes.

In addition, in the electrode printing step of the method for producing a crystalline silicon solar cell of the present invention, after having printed the electro-conductive paste for a finger electrode on the impurity diffusion layer 4 of the crystalline silicon substrate 1 or on the antireflective film 2 on the impurity diffusion layer 4 so as to form a pattern of the finger electrodes (the light incident side finger electrodes 20b), the electro-conductive paste for forming a bus bar electrode can be printed on the impurity diffusion layer 4 of the crystalline silicon substrate 1 or on the antireflective film 2 on the impurity diffusion layer so as to form a pattern of the bus bar electrodes (the light incident side bus bar electrodes 20a). In the case of this method, since the electro-conductive paste for a bus bar electrode is printed as the pattern of the finger electrodes as well, the thickness of the finger electrodes can be increased. Consequently, electrical resistance of the finger electrodes can be reduced in comparison with the case of printing the finger electrodes with only the electro-conductive paste for a finger electrode.

In the method for producing a crystalline silicon solar cell of the present invention, when firing an electro-conductive paste printed on the surface of the light incident side of the crystalline silicon substrate 1, and particularly the electro-conductive paste for forming a finger electrode, to form the light incident side electrode 20, the light incident side electrode 20 are preferably formed so as to contact the impurity diffusion layer 4 as a result of the electro-conductive paste firing through the antireflective film 2. As a result, contact resistance between the light incident side electrode 20 and the impurity diffusion layer 4 can be reduced. This type of electro-conductive paste for forming the light incident side electrode 20 is known.

The crystalline silicon solar cell of the prevent invention can be produced according to the production method as described above.

The crystalline silicon solar cell able to be produced according to the production method as described above contains 0.05% by weight to 1.2% by weight of elemental Te as $TeO_2$ in the bus bar electrode. Consequently, in the crystalline silicon solar cell of the present invention, adhesive strength can be increased when soldering between a metal ribbon and the bus bar electrode.

A solar cell module can be obtained by electrically connecting the crystalline silicon solar cells of the present invention obtained in the manner described above with interconnecting metal ribbons, and laminating on a glass plate, sealant or protective sheet and the like. A metal ribbon, the periphery of which is surrounded by solder (such as a ribbon using copper for the material thereof), can be used for the interconnecting metal ribbon. Commercially available solder, such as solder having tin as the main component thereof; specifically in the manner of leaded solder containing lead or lead-free solder, can be used as solder. In the crystalline silicon solar cell of the present invention, formation of at least a portion of the electrodes using the electro-conductive paste of the present invention makes it possible to provide a crystalline silicon solar cell demonstrating high adhesive strength between a bus bar electrode and a metal ribbon, and particularly demonstrating high adhesive strength after aging treatment, when connecting interconnecting metal ribbon to the electrodes of a plurality of crystalline silicon solar cells.

EXAMPLES

Although the following provides a detailed explanation of the present invention through examples thereof, the present invention is not limited to these examples.

<Materials and Preparation Ratios of Electro-Conductive Paste>

The compositions of the electro-conductive pastes used to produce solar cells in the examples and comparative examples are as indicated below.

(A) Electro-Conductive Powder

Ag (100 parts by weight) in the form of spheres having a BET value of 0.6 m$^2$/g and average particle diameter D50 of 1.4 μm was used for the electro-conductive powder.

(B) Glass Frit

Glass frit incorporating the components shown in Table 1 was used in each of the examples and comparative examples. The added amounts of the glass frit based on 100 parts by weight of the electro-conductive powder are as shown in Table 1. Furthermore, the average particle diameter D50 of the glass frit was 2 μm.

(C) Organic Binder

Ethyl cellulose (1 part by weight) having an epoxy content of 48% by weight to 49.5% by weight was used for the organic binder.

(D) Solvent

Butyl carbitol acetate (11 parts by weight) was used for the solvent.

Next, the materials in the prescribed preparation ratios indicated above were mixed with a planetary mixer and further dispersed with a three-roll mill followed by forming into a paste to prepare an electro-conductive paste.

<Measurement of Soldering Adhesive Strength>

The electro-conductive paste of the present invention was evaluated by producing test substrates for soldering adhesive strength, which simulates solar cells, using the prepared electro-conductive paste and measuring the soldering adhesive strength thereof. The method used to produce the test substrates is as indicated below.

B (boron)-doped p-type Si single crystal substrates (substrate thickness: 200 μm) were used for the substrates.

First, a silicon oxide layer was formed on the aforementioned substrates at a thickness of 20 μm by dry oxidation followed by etching with a solution consisting of a mixture of hydrogen fluoride, pure water and ammonium fluoride to remove damage from the substrate surface. Moreover, heavy metals were cleaned off the substrates with an aqueous solution containing hydrochloric acid and hydrogen peroxide.

Next, the surfaces of the substrates were textured (by forming surface irregularities thereon) by wet etching. More specifically, pyramid-like textured structures were formed on one side (surface on the light incident side) by wet etching (aqueous sodium hydroxide solution). Subsequently, the substrates were cleaned with an aqueous solution containing hydrochloric acid and hydrogen peroxide.

Next, phosphorous was diffused on the substrate surface having the aforementioned pyramid-like structures for 30 minutes at 950° C. by diffusion using phosphorous oxychloride (POCl$_3$) to form an n-type diffusion layer to a depth of about 0.5 μm. The sheet resistance of the n-type diffusion layer was 60/square.

Next, a silicon nitride thin film was formed to a thickness of about 60 nm on the surface of the substrate having an n-type diffusion layer formed thereon by plasma CVD using silane gas and ammonia gas. More specifically, a silicon nitride thin film (antireflective film 2) having a thickness of about 60 nm was formed by plasma CVD by subjecting a mixed gas (pressure: 1 Torr, 133 Pa), having a ratio of NH$_4$/SiH$_4$ of 0.5, to glow discharge decomposition.

Solar cells obtained in this manner were used after cutting into the shape of squares measuring 15 mm×15 mm.

The electro-conductive paste for forming light incident side (front side) electrodes was printed by screen printing. The electro-conductive paste was printed in a pattern consisting of the light incident side bus bar electrode 20a having a width of 2 mm and the light incident side finger electrodes 20b having a width of 100 μm to a film thickness of about 20 μm on the antireflective film 2 of the aforementioned substrates followed by drying for about 1 minute at 150° C.

Furthermore, the back side electrode 15 was not required in testing for measuring adhesive strength in the light incident side (front side) electrode. Thus, the back side electrode 15 was not formed.

Substrates having electro-conductive paste printed on the surface thereof in the manner described above were fired in air under prescribed conditions using a near infrared firing furnace using a halogen lamp for the heating source (Solar Cell High-Speed Firing Test Furnace, NGK Insulators, Ltd.). Firing conditions consisted of a peak temperature of 775° C. and simultaneously firing both sides in air at a furnace in-out time of 30 seconds. The test substrates for soldering adhesive strength were fabricated in the manner described above.

Samples for measuring adhesive strength of metal ribbon soldered thereto were fabricated and measured in the manner indicated below. Samples for measuring adhesive strength were obtained by soldering interconnecting metal ribbon in the form of copper ribbon (width: 1.5 mm×total thickness: 0.16 mm, coated with eutectic solder (tin:lead weight ratio: 64:36) at a film thickness of about 40 μm) to bus bar electrodes of the aforementioned test substrates for soldering adhesive strength of 15 mm square for 3 seconds at a temperature of 250° C. on a soldering pad using flux. Subsequently, a ring-shaped portion provided on one end of the ribbon was pulled in a direction 90 degrees to the substrate surface with a digital tension gauge (Digital Force Gauge Model AD-4932-50N, A & D Co., Ltd.) followed by measuring adhesive strength (initial soldering adhesive strength) by measuring the breaking strength of adhesion. Furthermore, 10 samples were fabricated followed by determining the average value thereof for use as the measured value. Furthermore, metal ribbon demonstrating adhesive strength of greater than 2 N can be said to have favorable adhesive strength that is capable of withstanding actual use.

Next, the aforementioned samples of the metal ribbon used to measure adhesive strength were subjected to aging treatment for 1 hour in a hot air drying oven at 150° C. Subsequently, the aforementioned initial soldering adhesive strength was measured in the same manner to measure soldering adhesive strength after aging treatment.

<Production of Single Crystal Silicon Solar Cells>

Single crystal silicon solar cells were produced in the same manner as the aforementioned test substrates for soldering adhesive strength with the exception of forming the back side electrodes 15.

More specifically, the back side electrode 15 was formed by printing electro-conductive paste for the back side electrode 15 by screen printing. Electro-conductive paste having aluminum particles, glass frit, ethyl cellulose and a solvent for the main components thereof was printed onto the back side of the aforementioned substrates over an area of 14 mm square followed by drying for about 60 seconds at 150° C. The film thickness of the electrode conductive paste for the back side electrode 15 after drying was about 20 Mm. Subsequently, both sides of the substrates were fired under the same firing conditions as the aforementioned test substrates for soldering adhesive strength. The single crystal silicon solar cells were fabricated in the manner described above.

Electrical characteristics of the single crystal silicon solar cells were measured in the manner indicated below. Namely, current-voltage characteristics of the produced solar cells were measured while irradiating with light from a solar simulator (AM 1.5, energy density: 100 mW/cm$^2$) followed by calculating open-circuit voltage (Voc) from the measurement results. Furthermore, two samples were fabricated under the same conditions followed by determining the measured value thereof as the average value of the two samples.

Examples 1 to 9 and Comparative Examples 1 to 4

The test substrates for soldering adhesive strength and the single crystal silicon solar cells of Examples 1 to 9 and Comparative Examples 1 to 4 were fabricated according to the previously described methods using electro-conductive pastes containing glass frit having the compositions shown in Table 1 in the added amounts shown in Table 1 in order to fabricate the test substrates for soldering adhesive strength and the single crystal silicon solar cells. The results of measuring initial soldering adhesive strength and soldering adhesive strength after aging of these test substrates for soldering adhesive strength, along with solar cell characteristics in the form of open-circuit voltage (Voc), are shown in Table 2.

As is clear from the measurement results shown in Table 2, initial soldering adhesive strength (N) was 2.8 N (Example 7) or higher for all of Examples 1 to 9 of the present invention, indicating that these examples can be said to demonstrate favorable adhesive strength in terms of initial soldering adhesive strength. In addition, soldering adhesive strength after aging (N) exceeded 2.0 N for all of Examples 1 to 9 of the present invention, indicating that these examples are capable of withstanding actual use based on soldering adhesive strength after aging.

In contrast, initial soldering adhesive strength (N) of the metal ribbon was a maximum of 2.7 N (Comparative Example 1) in Comparative Example 1 to 4, and was 2.0 N or less in Comparative Examples 2 to 4. Thus, metal ribbon initial soldering adhesive strength (N) of Comparative Examples 1 to 4 was lower than the aforementioned initial soldering adhesive strength of Examples 1 to 9, and Comparative Examples 1 to 4 cannot be said to have favorable adhesive strength based on initial soldering adhesive strength. In addition, soldering adhesive strength after aging (N) of the comparative examples was a maximum of 1.5 N (Comparative Example 2), with all of the values being 2.0 N or less, and these examples were unable to withstand actual use based on soldering adhesive strength after aging.

Based on the above results, in the case of Examples 1 to 9 of the present invention, it was clearly determined that favorable adhesive strength can be obtained for both initial soldering adhesive strength and soldering adhesive strength after aging in comparison with Comparative Examples 1 to 4.

With respect to the measurement results for open-circuit voltage (Voc), in the case of the single crystal silicon solar cells of Comparative Example 3, containing 38.87% by weight of TeO$_2$ in the glass fit, and Comparative Example 4, containing 64.00% by weight of TeO$_2$ in the glass frit, open-circuit voltage (Voc) was less than 0.63 V and favorable open-circuit voltage (Voc) was unable to be obtained. In contrast, in the case of the single crystal silicon solar cells of Examples 1 to 9, open-circuit voltage (Voc) was a minimum of 0.635 V (Example 9, and favorable open-circuit voltage (Voc) was able to be obtained.

Furthermore, although the electro-conductive paste of the present invention has been explained using single crystal silicon solar cells, application of the electro-conductive paste of the present invention is not limited to forming electrodes of crystalline silicon solar cells. The electro-conductive paste of the present invention can also be used to form the electrodes of ordinary semiconductor devices.

TABLE 1

|  | Comparative Example 1 | Example 1 | Example 2 | Example 3 | Example 4 | Comparative Example 2 | Comparative Example 3 |
|---|---|---|---|---|---|---|---|
| Electroconductive particles (parts by weight) | 100 | 100 | 100 | 100 | 100 | 100 | 100 |
| Glass frit (parts by weight) | 1.94 | 2.14 | 2.34 | 2.54 | 2.94 | 3.94 | 4.94 |
| TeO$_2$ content in (electroconductive particles + glass frit) (wt %) | 0.00 | 0.13 | 0.26 | 0.37 | 0.62 | 1.23 | 1.83 |
| SiO$_2$ in glass frit (wt %) | 4.90 | 4.44 | 4.06 | 3.74 | 3.23 | 2.41 | 1.92 |
| B$_2$O$_3$ in glass frit (wt %) | 8.54 | 7.74 | 7.08 | 6.52 | 5.63 | 4.20 | 3.35 |
| PbO in glass frit (wt %) | 11.22 | 10.26 | 9.47 | 8.80 | 7.74 | 6.03 | 5.01 |
| Bi$_2$O$_3$ in glass frit (wt %) | 61.26 | 57.87 | 55.06 | 52.70 | 48.93 | 42.86 | 39.24 |
| TeO$_2$ in glass frit (wt %) | 0.00 | 5.98 | 10.94 | 15.12 | 21.77 | 32.49 | 38.87 |
| BaO in glass frit (wt %) | 0.68 | 1.55 | 2.27 | 2.88 | 3.85 | 5.41 | 6.34 |
| Al$_2$O$_3$ in glass frit (wt %) | 0.42 | 0.38 | 0.35 | 0.32 | 0.28 | 0.21 | 0.17 |
| SrO in glass frit (wt %) | 0.93 | 0.85 | 0.77 | 0.71 | 0.62 | 0.46 | 0.37 |
| ZnO in glass frit (wt %) | 12.05 | 10.92 | 9.99 | 9.20 | 7.95 | 5.93 | 4.73 |
| Total amount of glass frit (wt %) | 100.00 | 100.00 | 100.00 | 100.00 | 100.00 | 100.00 | 100.00 |
| Total content ratio of PbO and Bi$_2$O$_3$ in glass frit (wt %) | 72.48 | 68.14 | 64.53 | 61.50 | 56.67 | 48.89 | 44.25 |

TABLE 1-continued

|  | Example 5 | Example 6 | Example 7 | Example 8 | Example 9 | Comparative Example 4 |
|---|---|---|---|---|---|---|
| Electroconductive particles (parts by weight) | 100 | 100 | 100 | 100 | 100 | 100 |
| Glass frit (parts by weight) | 2.4 | 2.5 | 2.8 | 3.2 | 3.8 | 2.45 |
| $TeO_2$ content in (electroconductive particles + glass frit) (wt %) | 0.38 | 0.37 | 0.47 | 0.62 | 0.86 | 1.53 |
| $SiO_2$ in glass frit (wt %) | 2.39 | 3.37 | 4.46 | 5.17 | 5.77 | 0.00 |
| $B_2O_3$ in glass frit (wt %) | 6.37 | 6.48 | 6.27 | 5.91 | 5.45 | 0.00 |
| PbO in glass frit (wt %) | 5.58 | 7.92 | 10.55 | 12.31 | 13.84 | 1.00 |
| $Bi_2O_3$ in glass frit (wt %) | 55.77 | 53.54 | 49.14 | 44.95 | 40.49 | 25.00 |
| $TeO_2$ in glass frit (wt %) | 16.00 | 15.36 | 17.14 | 20.00 | 23.58 | 64.00 |
| BaO in glass frit (wt %) | 3.05 | 2.93 | 3.15 | 3.54 | 4.03 | 10.00 |
| $Al_2O_3$ in glass frit (wt %) | 0.34 | 0.33 | 0.29 | 0.26 | 0.22 | 0.00 |
| SrO in glass frit (wt %) | 0.75 | 0.72 | 0.65 | 0.57 | 0.48 | 0.00 |
| ZnO in glass frit (wt %) | 9.74 | 9.35 | 8.35 | 7.30 | 6.15 | 0.00 |
| Total amount of glass frit (wt %) | 100.00 | 100.00 | 100.00 | 100.00 | 100.00 | 100.00 |
| Total content ratio of PbO and $Bi_2O_3$ in glass frit (wt %) | 61.35 | 61.46 | 59.70 | 57.27 | 54.33 | 26.00 |

TABLE 2

|  | Comparative Example 1 | Example 1 | Example 2 | Example 3 | Example 4 | Comparative Example 2 | Comparative Example 3 |
|---|---|---|---|---|---|---|---|
| Initial soldering adhesive strength (N) | 2.7 | 3.5 | 3.2 | 3.3 | 3.1 | 2.0 | 1.3 |
| Soldering adhesive strength (N) after aging for 1 hour at 150° C. | 0.4 | 2.5 | 2.5 | 2.4 | 2.3 | 1.5 | 1.2 |
| Quality of soidering adhesive strength | Poor | Good | Good | Good | Good | Poor | Poor |
| Voc (firing temperature: 775° C.) (V) | 0.637 | 0.636 | 0.637 | 0.637 | 0.636 | 0.630 | 0.628 |
| Quality of Voc | Good | Good | Good | Good | Good | Good | Poor |

|  | Example 5 | Example 6 | Example 7 | Example 8 | Example 9 | Comparative Example 4 |
|---|---|---|---|---|---|---|
| Initial soldering adhesive strength (N) | 3.0 | 3.3 | 2.8 | 3.0 | 3.0 | 1.5 |
| Soldering adhesive strength (N) after aging for 1 hour at 150° C. | 2.1 | 2.2 | 2.1 | 2.2 | 2.4 | 0.9 |
| Quality of soidering adhesive strength | Good | Good | Good | Good | Good | Poor |
| Voc (firing temperature: 775° C.) (V) | 0.636 | 0.636 | 0.636 | 0.636 | 0.635 | 0.627 |
| Quality of Voc | Good | Good | Good | Good | Good | Poor |

BRIEF DESCRIPTION OF THE REFERENCE SYMBOLS

1 Crystalline silicon substrate (p-type crystalline silicon substrate)
2 Antireflective film
4 Impurity diffusion layer (n-type impurity diffusion layer)
15 Back side electrode
15a Back side bus bar electrode
15b Back side electrode (back side full-surface electrode)
20 Light incident side electrode (front side electrode)
20a Light incident side bus bar electrode
20b Light incident side finger electrode

The invention claimed is:

1. An electro-conductive paste set for use with solar cells comprising an electro-conductive paste for forming a bus bar electrode and an electro-conductive paste for forming a finger electrode, wherein:
   the electro-conductive paste for forming a bus bar electrode comprises an electro-conductive powder, a multiple oxide containing tellurium oxide, and an organic vehicle, wherein the electro-conductive paste contains 0.1 parts by weight to 10 parts by weight of the multiple oxide based on 100 parts by weight of the electro-conductive powder, and wherein a content ratio of the tellurium oxide in 100% by weight of the multiple oxide as $TeO_2$ is 3% by weight to 30% by weight,
   the electro-conductive paste for forming a finger electrode contains an electro-conductive powder, a multiple oxide in an amount of 0.1 parts by weight to 10 parts by weight based on 100 parts by weight of the electro-conductive powder, and an organic vehicle, and
   a content ratio of tellurium oxide in the multiple oxide in the electro-conductive paste for forming the finger electrode is higher than a content ratio of tellurium oxide in the multiple oxide in the electro-conductive paste for forming the bus bar electrode.

2. The electro-conductive paste set according to claim 1, wherein the content ratio of tellurium oxide in the multiple oxide of the electro-conductive paste for forming the finger electrode as $TeO_2$ is 25% by weight to 75% by weight.

3. A method for producing a crystalline silicon solar cell, the method comprising:
   printing each of the electro-conductive paste for a bus bar electrode and the electro-conductive paste for a finger electrode of the electro-conductive paste set according to claim 1 on an impurity diffusion layer of a crystalline silicon substrate or on an antireflective film on an impurity diffusion layer; and forming a bus bar electrode and a finger electrode by drying and firing the printed electro-conductive pastes.

4. The method for producing a crystalline silicon solar cell according to claim 3, wherein the printing the electro-conductive paste comprises:
  printing the electro-conductive paste for a finger electrode on the impurity diffusion layer of the crystalline silicon substrate or the antireflective film on the impurity diffusion layer, so as to serve as a pattern of the finger electrode; and
  printing the electro-conductive paste for a bus bar electrode on the impurity diffusion layer of the crystalline silicon substrate or the antireflective film on the impurity diffusion layer so as to serve as a pattern of the bus bar electrode.

5. The method for producing a crystalline silicon solar cell according to claim 3, wherein the printing the electro-conductive paste comprises:
  printing the electro-conductive paste for a finger electrode on the impurity diffusion layer of the crystalline silicon substrate or on the antireflective film on the impurity diffusion layer so as to serve as a pattern of the finger electrode; and
  printing the electro-conductive paste for a bus bar electrode on the impurity diffusion layer of the crystalline silicon substrate or the antireflective film on the impurity diffusion layer so as to serve as a pattern of the finger electrode and the bus bar electrode, in that order.

6. The electro-conductive paste set according to claim 1, wherein the multiple oxide in the electro-conductive paste for forming a bus bar electrode further contains at least one oxide selected from the group consisting of $Bi_2O_3$ and PbO.

7. The electro-conductive paste set according to claim 6, wherein a total content of $Bi_2O_3$ and PbO in 100% by weight of the multiple oxide in the electro-conductive paste for forming a bus bar electrode is 50% by weight to 97% by weight.

8. The electro-conductive paste set according to claim 7, wherein a content ratio of PbO in 100% by weight of the multiple oxide in the electro-conductive paste for forming a bus bar electrode is 5% by weight to 30% by weight.

9. The electro-conductive paste set according to claim 7, wherein a content ratio of $Bi_2O_3$ in 100% by weight of the multiple oxide in the electro-conductive paste for forming a bus bar electrode is 30% by weight to 80% by weight.

10. The electro-conductive paste set according to claim 6, wherein the multiple oxide in the electro-conductive paste for forming a bus bar electrode further comprises at least one oxide selected from the group consisting of $SiO_2$, $B_2O_3$, $Li_2O$, $Na_2O$, $K_2O$, MgO, CaO, BaO, SrO, ZnO, $Al_2O_3$, $TiO_2$ and $ZrO_2$.

11. The electro-conductive paste set according to claim 1, wherein the electro-conductive powder in the electro-conductive paste for forming a bus bar electrode is a silver powder.

* * * * *